US008688066B2

(12) United States Patent
Winoto et al.

(10) Patent No.: US 8,688,066 B2
(45) Date of Patent: Apr. 1, 2014

(54) RF PEAK DETECTION SCHEME USING BASEBAND CIRCUITS

(75) Inventors: Renaldi Winoto, Danville, CA (US);
Jinho Park, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 59 days.

(21) Appl. No.: 13/308,325

(22) Filed: Nov. 30, 2011

(65) Prior Publication Data

US 2012/0142298 A1    Jun. 7, 2012

Related U.S. Application Data (60) Provisional application No. 61/420,601, filed on Dec. 7, 2010.

(51) Int. Cl.
*H04B 17/00* (2006.01)
*H04B 1/06* (2006.01)
*H04B 7/00* (2006.01)

(52) U.S. Cl.
USPC ................... 455/226.2; 455/234.1

(58) Field of Classification Search
USPC .......... 455/232.1, 234.1, 234.2, 250.1, 253.2, 455/293, 226.1, 226.2; 375/345
See application file for complete search history.

(56) References Cited

U.S. PATENT DOCUMENTS

| | | | |
|---|---|---|---|
| 5,758,274 | A | 5/1998 | Vu et al. |
| 6,516,185 | B1 | 2/2003 | Macnally |
| 7,593,484 | B2 | 9/2009 | Beamish et al. |
| 2003/0087625 | A1* | 5/2003 | Conti ............................ 455/323 |
| 2005/0032495 | A1 | 2/2005 | Stalf et al. |
| 2005/0197092 | A1* | 9/2005 | Darabi ......................... 455/323 |
| 2009/0209220 | A1* | 8/2009 | Beck et al. ................. 455/234.1 |

OTHER PUBLICATIONS

International Search Report, PCT Application No. PCT/US20111/062703, mailed Feb. 3, 2012.

* cited by examiner

*Primary Examiner* — Nguyen Vo (57) ABSTRACT

A receiver includes an antenna configured to receive a set of RF signals, and a low-noise amplifier (LNA) coupled to the antenna and amplify the set of RF signals to generate a set of amplified signals. The receiver further includes a down-conversion mixer configured to down convert the set of amplified signals to baseband frequencies. The receiver further includes a low-pass filter configured to filter from the set of amplified signals to baseband frequencies an out-of-band signal. The receiver further includes a high-pass filter configured to reverse the filtering of the low-pass filter. The receiver further includes a peak detector configured to determine whether the LNA is operating at saturation; and an automatic-gain controller configured to decrease a gain of the LNA based on the determination of the peak detector.

25 Claims, 8 Drawing Sheets

RF PEAK DETECTION SCHEME USING BASEBAND CIRCUITS

CROSS REFERENCE TO RELATED APPLICATIONS

This application claims the benefit of, and priority to, U.S. Provisional Patent App. No. 61/420,601, filed Dec. 7, 2010, titled "AN RF PEAK DETECTION SCHEME USING BASEBAND CIRCUITS," of Winoto et al. and which is incorporated herein by reference in its entirety for all purposes.

BACKGROUND

Embodiments described herein generally relate to radio frequency (RF) receivers, and more particularly embodiments described herein relate to an RF peak detector circuit and an RF peak detector circuit method.

Unless otherwise indicated herein, the circuits and method described in the background section of this application are not prior art to the claims in this application and are not admitted to be prior art by inclusion in the background section.

RF receivers are used for receiving RF signals in numerous devices including personal mobile devices, such as mobile telephones, personal digital assistants (PDAs), computers, tablet computers, radios, global positioning system (GPS) receivers, and the like. RF receivers include an antenna configured to capture an RF signal and often include a low-noise amplifier (LNA) for amplifying the RF signal. LNAs are configured to amplify relatively weak RF signals captured by an antenna. LNA are typically located close to an antenna to reduce losses in a circuit path from the antenna to the LNA. LNAs are often relatively high power devices that amplify an RF signal with relatively low noise and relatively little distortion introduced by the LNA.

Peak detectors are often included in an RF receiver at "critical" nodes of the RF receiver. Various critical nodes of an RF receiver include nodes that are after amplification stages, such as after LNAs. Peak detectors are often configured to operate in conjunction with an LNA and detect the power of the RF signal, or the like, output by the LNA. A peak detector may be configured to detect whether an LNA is saturated and/or operating non-linearly. A peak detector may be configured to operate in conjunction with an automatic gain controller that may receive a signal from a peak detector for lowering the gain of the LNA is operating in a saturation mode and/or is otherwise operating non-linearly. A peak detector operating in conjunction with an automatic gain controller is configured to provide that an LNA can operate with relatively high gain (e.g., maximum gain) and with relatively high sensitivity (e.g., maximum sensitivity).

Figure 1:
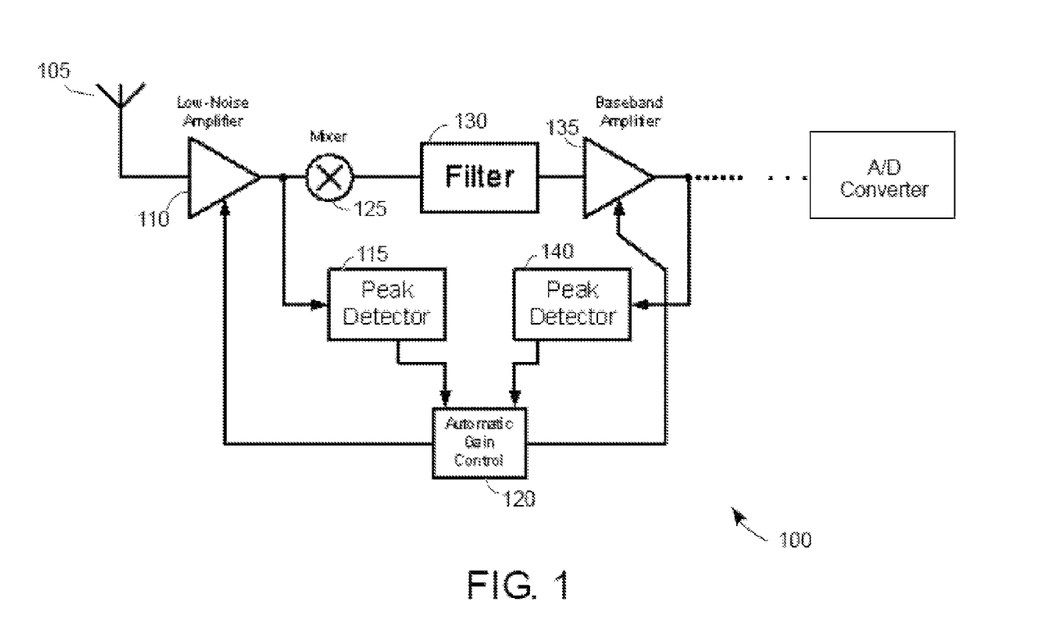
FIG. 1 is a simplified schematic of a traditional RF receiver.

FIG. 1 is a simplified schematic of a traditional RF receiver 100 that includes an antenna 105, an LNA 110, a first peak detector 115, an automatic gain controller 120, a down-conversion mixer 125, a low-pass filter 130, a baseband amplifier 135, and a second peak detector 140. The antenna is configured to receive an RF signal and provide the RF signal to the LNA, which is configured to amplify the RF signal. The power of the amplified RF signal may be detected by the peak detector, which may provide a signal to the automatic gain controller for controlling the gain of the LNA to present the LNA from saturating. Subsequent to amplification by the LNA, the RF signal may be down converted to a baseband (e.g., 0-20 Mhz, 0-40 Mhz, etc.) by the down-conversion mixer and filtered by the filter to remove out-of-band signals (e.g., blocking signals). The filtered baseband signal may then be amplified by the baseband filter. The power of the amplified baseband signal may be detected by the second peak detector and provide a signal to the automatic gain controller for controlling the gain of the baseband amplifier. Subsequent processing of the RF signals may include digital to analog conversion and processing.

The node between the LNA and the down-conversion mixer is a critical node of the circuit operating at high frequency. The peak detector introduces a parasitic load on the LNA at the critical node and tends to degrade the operation of the LNA and hence degrade the operation of the RF receiver. One goal for RF receivers is to lower the parasitic load of the peak detector on the LNA. A peak detector may be designed for relatively low parasitic loading on an LNA at the expense of relatively high power consumption by the peak detector and relatively high circuit area on an IC.

Therefore, new circuit designs are needed for RF receivers for reducing the loading of peak detectors on amplification stages where the peak detectors are not relatively high power consumption and do not take up a relatively large area on an IC.

SUMMARY

Embodiments described herein generally relate to radio frequency (RF) receivers, and more particularly embodiments described herein relate to an RF peak detector circuit and an RF peak detector circuit method.

According to one embodiment, a receiver includes an antenna configured to receive a set of signals and a low-noise amplifier (LNA) coupled to the antenna. The LNA is configured to receive the set of signals from the antenna and amplify the set of signals to generate a set of amplified signals. The receiver further includes a down-conversion mixer coupled to the LNA. The down-conversion mixer is configured to receive the set of amplified signals from the LNA and down convert the set of amplified signals to a set of baseband frequencies. The receiver further includes a first filter coupled to the down-conversion mixer where the filter is configured to receive the set of amplified signals at the baseband frequencies from the down-conversion mixer. The first filter is configured to filter from the set of amplified signals out-of-band signals. The receiver further includes a second filter coupled to the first filter where the second filter is configured to receive the set of amplified signals at the baseband frequencies subsequent to filtering by the first filter. The second filter is configured to reverse the filtering of the first filter. The receiver further includes a peak detector coupled to the second filter where the peak detector is configured to receive the set of amplified signals at the baseband frequencies from the second filter. The peak detector is further configured to determine whether the LNA is operating at saturation based on the amplitudes of the signals in the set of amplified signals at the baseband frequencies. The receiver further includes an automatic-gain controller coupled to the peak detector and configured to receive a signal from the peak detector for controlling a gain of the LNA.

According to a specific embodiment, the automatic-gain controller is configured to reduce the gain of the LNA if the LNA is operating at saturation based on the peak detector determining whether the LNA is saturating based on an analysis of the amplitudes of the amplified signals in the set of amplified signals at the baseband frequencies.

According to another specific embodiment, the first filter is a low-pass filter and may include a set of low-pass poles.

According to another specific embodiment, the first filter is a band-pass filter.

According to another specific embodiment, the second filter is a high-pass filter.

According to another specific embodiment, the signals in the set of signals include radio frequency (RF) signals. The signals may also include a target signal and an out-of-band signal.

According to another specific embodiment, the receiver further includes an amplifier coupled to the first filter where the amplifier is configured to receive the set of amplified signals at the baseband subsequent to filtering by the first filter and amplify the set of amplified signals at the baseband subsequent to filtering by the first filter. The down-conversion mixer may be a passive mixer or a Gilbert-cell mixer.

According to another specific embodiment, the receiver further includes a second peak detector coupled to the amplifier. The second peak detector is configured to receive the set of amplified signals at the baseband frequencies subsequent to filtering by the first filter. The automatic-gain controller is configured to reduce a gain of the amplifier if the amplifier is operating at saturation based on the second peak detector determining whether the amplifier is saturating based on an analysis of the set of amplified signals at the baseband frequencies subsequent to filtering by the first filter.

According to another specific embodiment, the first filter, the second filter, and the peak detector are configured to operate at baseband frequencies.

According to another embodiment, a receiver includes an antenna configured to receive a set of signals and a low-noise amplifier (LNA) having a first input coupled to the antenna. The receiver further includes a down-conversion mixer having an input coupled to an output of the LNA and a low-pass filter having an input coupled to an output of the down-conversion mixer. The receiver further includes a high-pass filter having an input coupled to an output of the low-pass filter and configured to reverse the filtering of the low-pass filter. The receiver further includes a peak detector having an input coupled to an output of the high-pass filter and is configured to determine whether the LNA is operating at saturation. The receiver further includes an automatic-gain controller having an input coupled to an output of the peak detector and an output coupled to a second input of the LNA to control a gain of the LNA.

According to another embodiment, a method of operating a receiver includes receiving a set of signals, such as RF signals, and amplifying the set of signals via low-noise amplification to generate a set of amplified signals. The method further includes down-converting the set of amplified signals to baseband frequencies and filtering from the set of amplified signals an out-of-band signal. The method further includes inverse filtering the set of amplified signals for relative increase of the out-of-band signal as compared to a target signal. The method further includes detecting a peak amplitude of the out-of-band signal subsequent to inverse filtering where the detecting step occurs at the baseband frequencies. The method further includes controlling a gain of the low-noise amplification based on the peak amplitude of the out-of-band signal subsequent to inverse filtering.

According to another specific embodiment, the method further includes baseband amplifying the set of amplified signals subsequent to the filtering step for subsequent processing.

According to another specific embodiment, the method further includes analog-to-digital conversion of the set of amplified signals subsequent to baseband amplifying.

The following detailed description and accompanying drawings provide a more detailed understanding of the nature and advantages of the present invention.

DETAILED DESCRIPTION

Embodiments described herein generally provide a radio frequency (RF) receiver, and more particularly embodiments described herein provide to an RF peak detector circuit and an RF peak detector circuit method, which provide relatively low parasitic loading.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

RF receivers are used for receiving RF signals in numerous devices including personal mobile devices, such as mobile telephones, personal digital assistants (PDAs), computers, laptop computers, tablet computers, radios, global positioning system (GPS) receivers, and the like. RF receivers include an antenna configured to capture RF signals and often include a low-noise amplifier (LNA) for amplifying the RF signals. LNAs are configured to amplify relatively weak RF signals captured by an antenna. An LNA is typically located close to an antenna to reduce losses in a circuit path from the antenna to the LNA. LNAs are often relatively high power devices that amplify RF signals with relatively low noise and relatively little distortion introduced by the LNA. Peak detectors are often configured to operate in conjunction with LNAs to prevent the LNAs from being saturated. However, peak detectors add a parasitic load to the LNAs inhibiting optimal performance of the LNAs. Embodiments described herein provide for relatively reduced loading on an LNA by a peak detector, which is configured to inhibit the LNA from operating at saturation.

Figure 2:
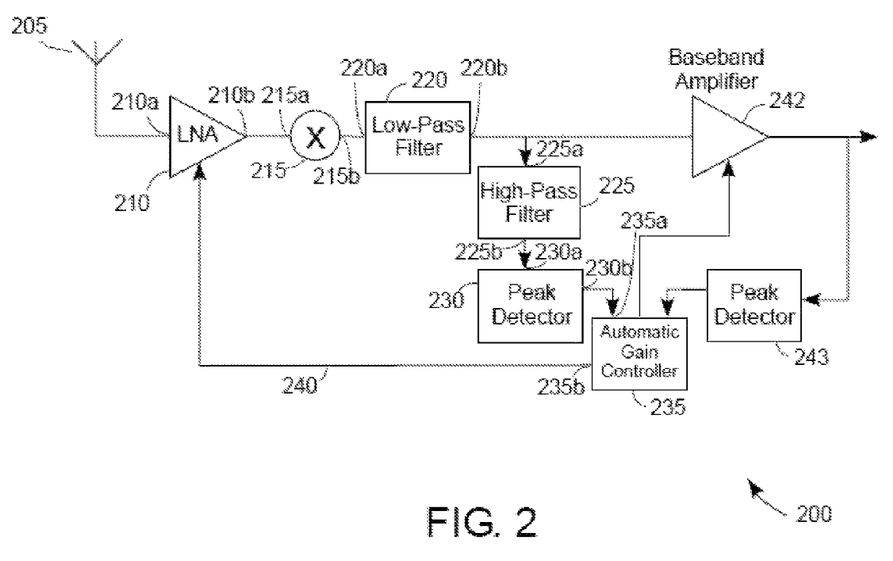
FIG. 2 is a simplified schematic of a receiver according to one embodiment.

FIG. 2 is a simplified schematic of a receiver 200, such as an RF receiver, according to one embodiment. It is noted that while receiver 200 is generally described herein as an RF receiver, the receiver is not so limited and may be configured to operate at frequencies of than RF frequencies. Receiver 200 includes an antenna 205, a LNA 210, a down-conversion mixer 215, a first filter 220 (e.g., a low-pass filter or a band-pass filter), a second filter 225 (e.g., a high-pass filter), a peak detector 230, and an automatic gain controller 235. For convenience, the first and second filters 220 and 225 are referred to herein as the low-pass filter and the high-pass filter, respectively. Antenna 205 is coupled to an input 210a of LNA 210 and is configured to provide a set of signals to the input of the LNA. A set as referred to herein includes one or more elements. An output 210b of LNA 210 is coupled to an input 215a of down-conversion mixer 215, and an output 215b of the down-conversion mixer is coupled to an input 220a of low-pass filer 220. An output 220b of low-pass filter 220 is coupled to an input 225a of high-pass filter 225. An output 225b of high-pass filter 225 is coupled to an input 230a of peak detector 230, and an output 230b of peak detector 230 is coupled to an input 235a of automatic gain controller 235. Via a feedback circuit path 240, an output 235b of automatic gain controller 235 is coupled to LNA 210 for controlling a gain of the LNA. The output 220b of low-pass filter 220 may be coupled to subsequent amplification stages, such as a subsequent baseband amplifier 242 or the like, which may have a gain controlled by a peak detector 243 and automatic gain controller 235. While the foregoing describes the interconnections of the circuit elements of receiver 200, a further function description of receiver 200 is described immediately below.

Figure 3:
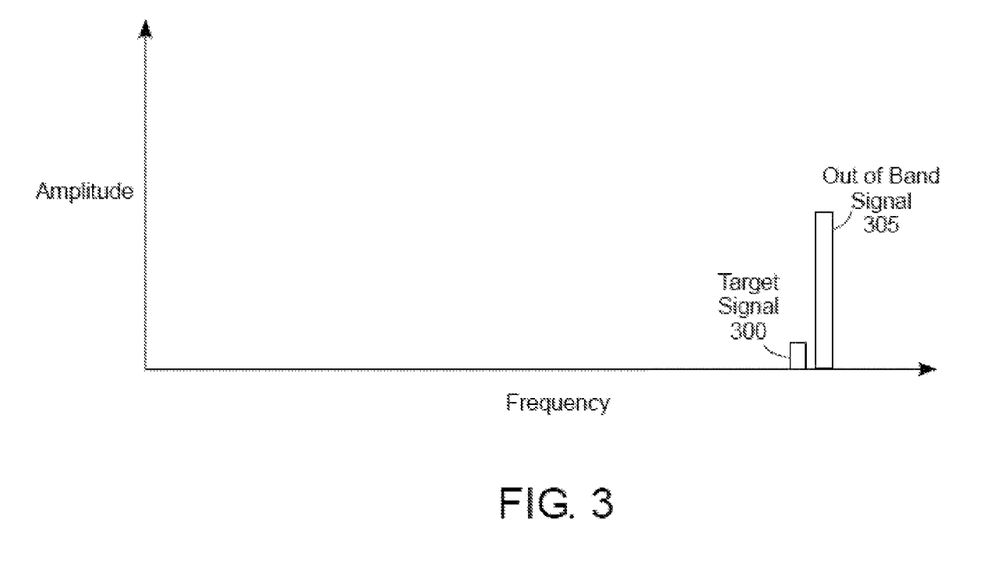
FIG. 3 is a simplified schematic of a set of RF signals that may be received by an antenna according to one embodiment.

According to one embodiment, antenna 205 is configured to receive a set of signals, such as a set of RF signals transmitted by an RF transmitter. The set of RF signals may be transmitted by one of a variety of RF transmitters, such as a cellular telephone transmitter, a WiFi router, a mobile device, etc. The set of signals received by antenna 205 may include a target signal having a target band. The set of signals received by antenna 205 may also include one or more out-of-band signals (e.g., blocking signals). A target signal is typically a signal of "interest" to a mobile device or the like, which includes receiver 200. For example, if the mobile device is a mobile telephone the target signal may include an RF band for mobile-voice communication. An out-of-band signal may be relatively close (e.g., have a relatively close frequency) to the target signal and may interfere with the target signal once the target signal and the out-of-band signal are received by the receiver. FIG. 3 is a simplified schematic of an example set of RF signals that may be received by antenna 205 where the set RF signals includes a target signal 300 and an out-of-band signal 305, which is relatively close (have a relatively close frequency) to the target signal. The RF frequencies may be, for example, at about 2.4 gigahertz or the like.

Via input 210a, LNA 210 is configured to receive the set of signals from antenna 205 and is configured to amplify the set of signals. LNA 210 is generally not a discriminating device and is configured to amplify all signals received in a set of signals. For example, LNA 210 is configured to amplify target signals and out-of-band signals. An out-of-band signal may have a relatively large amplitude compared to a target signal (see FIG. 3) and may cause LNA 210 to saturate. Because the out-of-band signal may have a relatively large amplitude and may cause LNA 210 to saturate, the target signal may not be amplified by the LNA as much possible if the LNA were not also amplifying the out-of-band signal.

Figure 4:
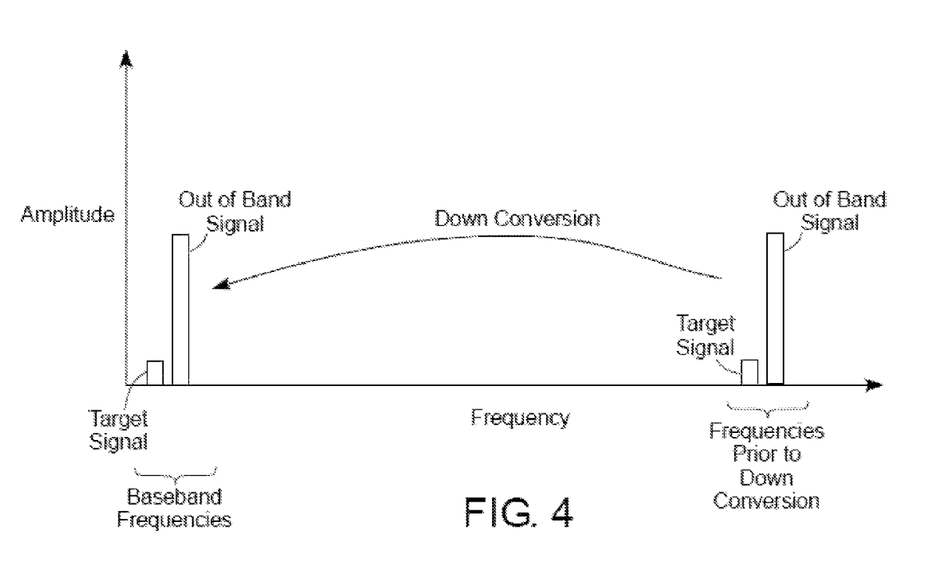
FIG. 4 is a simplified schematic of an example set of signals down converted to a set of baseband frequencies according to one embodiment.

According to one embodiment, after LNA 210 amplifies the set of signals received from the antenna, the set of signals are down converted to a set of baseband frequencies (i.e., relatively low frequencies) by down-conversion mixer 215. The set of signals in the set of baseband frequencies is sometimes referred to herein as the set of baseband signals. The signals in the set of baseband signals maintain their relative composition (amplitude and relative frequency spacing) compared to the composition of the signals as received by the antenna. FIG. 4 is a simplified schematic of the example set of signals down converted to a set of baseband signals and shows the example set of signals prior to down conversion. As shown in FIG. 4, the set of signals as received by the antenna and in the set of baseband signals have the same relative composition.

Figure 5:
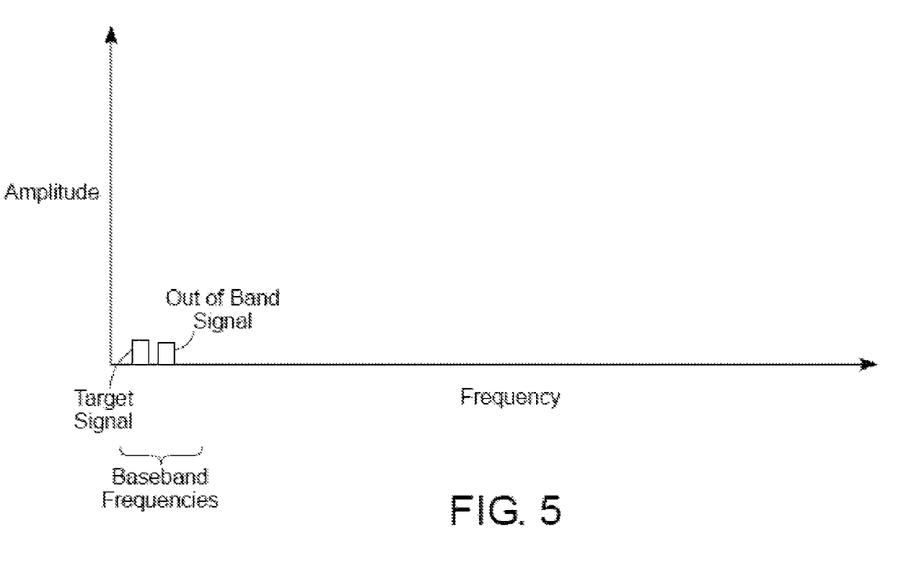
FIG. 5 is a simplified schematic of the example set of signals shown in FIG. 4 subsequent to being filtered by the low-pass filter.

According to one embodiment, low-pass filter 220 is configured to receive the set of signals in the baseband frequencies from down-conversion mixer 215, and filter from the set of baseband signals the out-of-band signals. The filtering of the out-of-band signals from the set of baseband signals is not ideal and typically a portion of the out-of-band signals pass through low-pass filter 220. FIG. 5 is a simplified schematic of the example set of baseband signals shown in FIG. 4 subsequent to being filtered by low-pass filter 220. Note that the out-of-band signals have a reduced amplitude but are not completely removed from the set of baseband signals. The set of baseband signals transmitted from low-pass filter 220 may be received by a subsequent amplification stage, an analog-to-digital convertor or the like. The set of baseband signals transmitted from low-pass filter 220 are also received by high-pass filter 225. High-pass filter 225 is configured to substantially invert the frequency response of low-pass filter 220. That is, high-pass filter 225 is configured to filter the target signal and substantially not filter the out-of-band signals. That is, while the amplitudes of the target signal and the out-of-band signals are reduced by low-pass filter 220 and high-pass filter 225, the amplitude of the target signal relative to the amplitude of the out-of-band signals remain the same after filtering by high-pass filter 225. For example, if the amplitude of the target signal is 30% less than the amplitude the out-of-band signal prior to filtering by low-pass filter 220 and high-pass filter 225, then the amplitude of the target signal remains substantially 30% less than the amplitude of the out-of-band signals subsequent to filtering by low-pass filter 220 and the high-filter even though the overall amplitudes of the target signal and the out-of-band signals are reduced.

Figure 6:
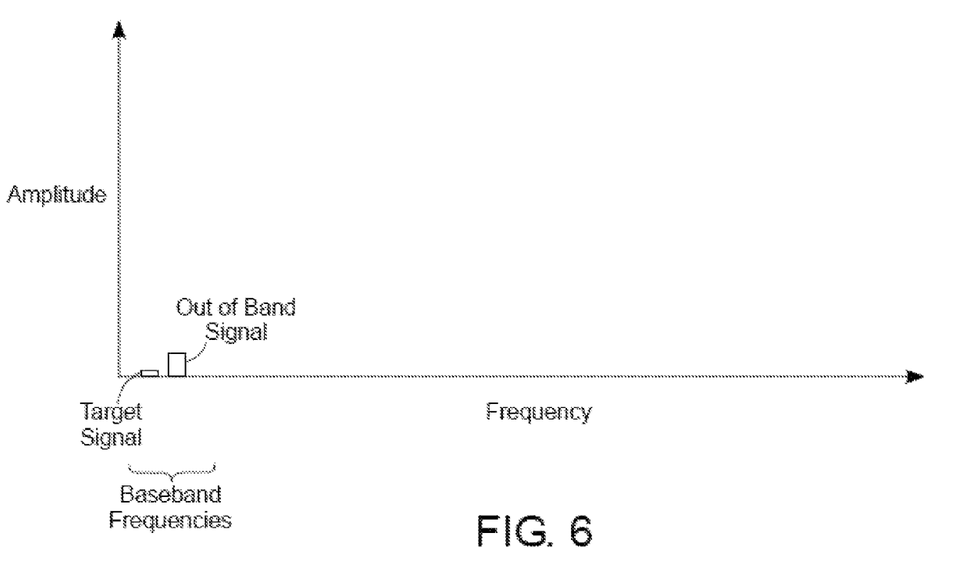
FIG. 6 is a simplified schematic of the composition of the example set of signals shown in FIGS. 4 and 5 subsequent to being filtered by the high-pass filter according to one embodiment.

FIG. 6 is a simplified schematic of the composition of the example set of baseband signals shown in FIGS. 4 and 5 subsequent to being filtered by high-pass filter 225. Note that the amplitude of the target signal relative to the amplitude out-of-band signals as shown in FIG. 6 subsequent to filtering by high-pass filter 225 is substantially the same as the amplitude of the target signal relative to the amplitude relative to the out-of-band signals prior to filtering by low-pass filter 220 and high-pass filter 225 as shown in FIG. 4.

Peak detector 230 is configured to receive the set of baseband signals from high-pass filter 225 and determine whether the gain of LNA 210 should be reduced. For example, peak detector 230 may be configured to determine whether LNA 210 is operating at saturation or is otherwise operating in a non-linear region of gain and send a signal to automatic gain controller 235 to reduce the gain of LNA 210 so that the LNA is not operating at saturation or is otherwise not operating in a non-linear region of gain.

Because the gain of LNA 210 is controlled based on a composition of the set of baseband signals (subsequent to down conversion and filtering), which has the same relative amplitudes as the composition of the set of signals (prior to down conversion and filtering), the gain of LNA 210 is controlled based on the largest-amplitude signal received by LNA 210 from the antenna. Therefore, the gain of LNA 210 may be relatively accurately controlled, even though the gain is controlled based on the set of signals down converted to baseband frequencies.

Figure 7:
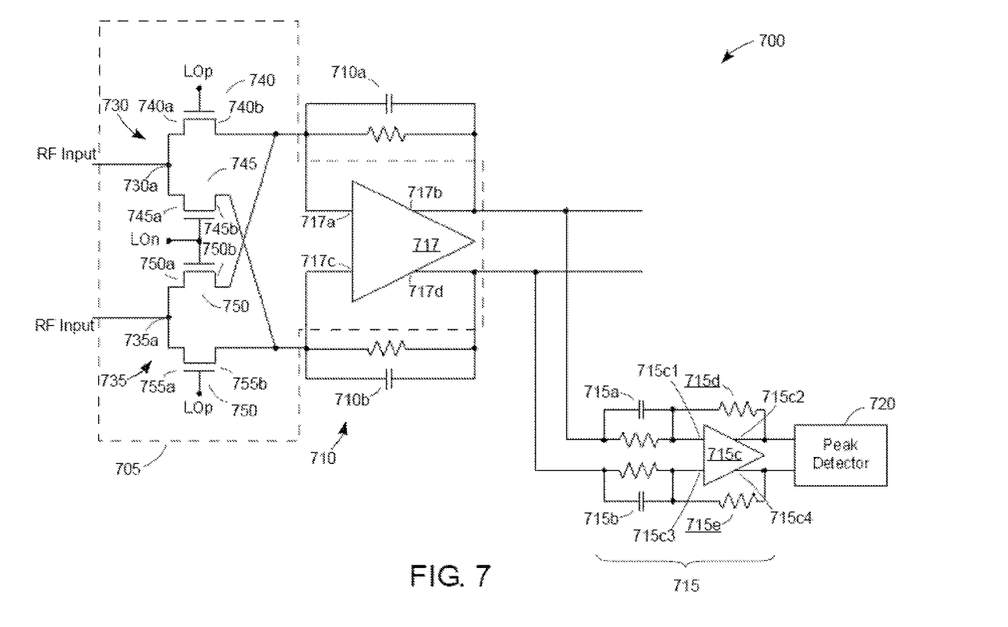
FIG. 7 is a further detailed schematic of a portion of a receiver according to one embodiment.
Figure 8:
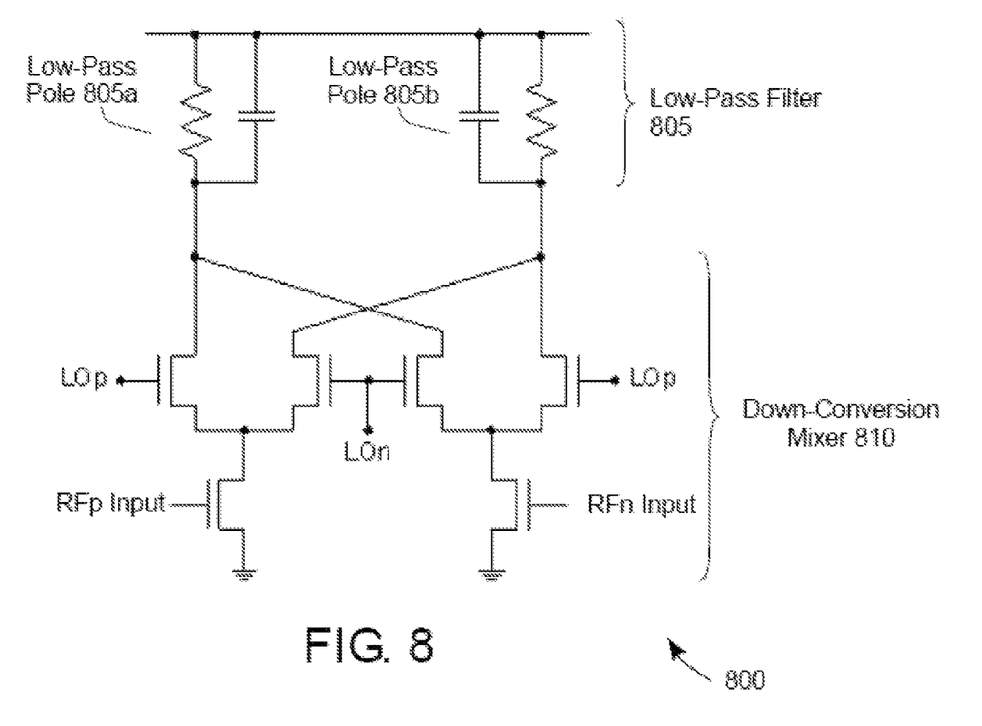
FIG. 8 is a simplified schematic of a Gilbert-cell mixer, which may be included in an antenna circuit according to various embodiments.

FIG. 7 is a further detailed schematic of a portion 700 of receiver 200 where the portion of the receiver includes a down-conversion mixer 705 (e.g., a passive mixer), a low-pass filter 710, a high-pass filter 715, and a peak detector 720 according to one embodiment. Down-conversion mixer 705 is generally indicated by the closed dashed line in FIG. 7. Down-conversion mixer 705, low-pass filter 710, high-pass filter 715, and a peak detector 720 are specific embodiments, respectively, of down-conversion mixer 215, low-pass filter 220, high-pass filter 225, and peak detector 230 described above with respect to FIGS. 2-6. While down-conversion mixer 705 is shown in FIG. 7 and described herein as a passive mixer, the mixer may be alternatively configured according to other embodiments of the present invention. For example, down-conversion mixer 705 may be a Gilbert-cell mixer or other mixer type. FIG. 8 is a simplified schematic of a Gilbert-cell mixer 800, which may be included in an antenna circuit according to various embodiments. Gilbert-cell mixers used in antenna circuits are well understood by those of skill in the art and will not be described in detail herein except to note that Gilbert-cell mixer 800 includes a low-pass filter 805, which includes low-pass pole filters 805a and 805b. Gilbert-cell mixer 800 also includes a mixer 810 coupled to low-pass filter 805. Passive mixer 700 is currently described in further detail.

Down-conversion mixer 705 may include differential-transistor circuits 730 and 735 with a first input node 730a and a second input node 735a for the respective differential-transistor circuits, and may include a differential amplifier 717. The first input node and the second input node are coupled to output of LNA 210 and are configured to receive the set of signals captured by the antenna as described above. Differential-transistor circuit 730 may include first and second transistors 740 and 745 where the first and second transistors have first source-drain regions 740a and 745a coupled to form first input node 730a. Differential-transistor circuit 735 may include first and second transistors 750 and 755 where the first and second transistors have first source-drain regions 750a and 755a coupled to form second input node 735a.

Transistor 740 may include a second source-drain region 740b, which is coupled to a second source drain region 750b of transistor 750, and these second source-drain regions 740b and 750b may be coupled to a first input 717a of differential amplifier 717. Second source-drain regions 740b and 750b may also be coupled to first low-pass pole 710a (e.g., an RC filter) of low-pass filter 710. First low-pass pole 710a may be coupled between the first input 717a of differential amplifier 717 and a first output 717b of the differential output.

Transistor 745 may include a second source-drain region 745b, which is coupled to a second source drain region 755b of transistor 755, and these second source-drain regions 745b and 755b may be coupled to a second input 717c of differential amplifier 717. Second source-drain regions 745b and 755b may also be coupled to second low-pass pole 710b (e.g., an RC filter) of low-pass filter 710. Second low-pass pole 710b may be coupled between the second input 717c of differential amplifier 717 and a second output 717d of the differential output. The low-pass poles are configured to provide the low-pass filtering described above with respect to FIGS. 2 and 5 for the set of signals down converted by the mixer. While low-pass filter 710 is described above as including first and second low-pass poles 710a and 710b, low-pass filter 710 may be alternatively configured, for example, to provide relatively more complicated filtering. The differential-transistor circuits may include nMOSFETS, pMOSFETS, or other transistor types as will be understood by those of skill in the art.

According to one embodiment, high-pass filter 715 includes a first high-pass pole 715a (e.g., an RC filter) and a second high-pass pole 715b (e.g., an RC filter). High-pass filter 715 is one specific embodiment of high-pass filter 225 shown generally in FIG. 2. High-pass filter 225 may also include a differential amplifier 715c and first and second feedback resistors 715d and 715e. The first high-pass pole 715a may be coupled between the first output 717b of differential amplifier 717 and a first input 715c1 of differential amplifier 715c. The first feedback resistor 715d may be coupled between the first input 715c1 of the differential amplifier and a first output 715c2 of the differential amplifier.

The second high-pass pole 715b may be coupled between the second output 717d of differential amplifier 717 and a second input 715c3 of differential amplifier 715c. The second feedback resistor 715e may be coupled between the second input 715c3 of the differential amplifier and a second output 715c4 of the differential amplifier. The first and second outputs of differential amplifier 715c may be coupled to the inputs of peak detector 720. The high-pass poles 715a and 715b are configured to provide the high-pass filtering described above with respect to FIGS. 2 and 5 for the set of signals down converted to the baseband frequencies. That is, the high-pass poles are configured to invert the filtering of the low-pass poles. Thereby, peak detector 720, while operating at baseband frequencies, may detect the amplitudes of the set of signals.

While high-pass filter 715 is described above as including first and second high-pass poles 715a and 715b, high-pass filter 715 may be alternatively configured, for example, to provide relatively more complicated filtering. High-pass filter 715 may be implemented with low-power circuits or may be implemented in passive circuits. The first and the second outputs of differential amplifier 717 may be coupled to a subsequent stage, such as a baseband filter, an analog-to-digital converter, or the like for subsequent processing as will be understood by those of skill in the art.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations, and equivalents may be employed without departing from the scope of the invention as defined by the claims.

What is claimed is:

1. A receiver comprising:
   an antenna configured to receive a set of signals including a first signal and a second signal having a first relative difference in amplitudes;
   a low-noise amplifier (LNA) coupled to the antenna, wherein the LNA is configured to receive the set of signals from the antenna and amplify the set of signals to generate a set of amplified signals;
   a down-conversion mixer coupled to the LNA, wherein the down-conversion mixer is configured to receive the set of amplified signals from the LNA and down convert the set of amplified signals to baseband frequencies;
   a first filter coupled to the down-conversion mixer, wherein the filter is configured to receive the set of amplified signals at the baseband frequencies from the down-conversion mixer and filter from the set of amplified signals the second signal;

a second filter coupled to the first filter, wherein the second filter is configured to receive the set of amplified signals at the baseband frequencies subsequent to filtering by the first filter and reverse the filtering of the first filter, such that the first signal and the second signal at the baseband frequencies have a second relative difference in amplitudes that is substantially similar to the first relative difference in amplitudes;

a peak detector coupled to the second filter, wherein the peak detector is configured to receive the set of amplified signals at the baseband frequencies from the second filter and determine whether the LNA is operating at saturation; and an automatic-gain controller coupled to the peak detector and configured to receive a signal from the peak detector for controlling a gain of the LNA.

2. The receiver of claim 1, wherein the automatic-gain controller is configured to reduce the gain of the LNA if the LNA is operating at saturation based on the peak detector determining whether the LNA is saturating based on an analysis of the set of amplified signals at the baseband frequencies.

3. The receiver of claim 1, wherein the first filter is a low-pass filter.

4. The receiver of claim 3, wherein the low-pass filter includes a set of low-pass poles.

5. The receiver of claim 1, wherein the first filter is a band-pass filter.

6. The receiver of claim 1, wherein the second filter is a high-pass filter.

7. The receiver of claim 1, wherein the first filter, the second filter, and the peak detector are configured to operate at baseband frequencies.

8. The receiver of claim 1, wherein the set of signals includes radio frequency (RF) signals, the first signal is a target signal, and the second signal is an out-of-band signal.

9. The receiver of claim 1, further comprising an amplifier coupled to the first filter, wherein the amplifier is configured to receive the set of amplified signals at the baseband subsequent to filtering by the first filter and amplify the set of amplified signals at the baseband subsequent to filtering by the first filter.

10. The receiver of claim 9, further comprising a second peak detector coupled to the amplifier, wherein:

the second peak detector is configured to receive the set of amplified signals at the baseband frequencies subsequent to filtering by the first filter, and the automatic-gain controller is configured to reduce a gain of the amplifier if the amplifier is operating at saturation based on the second peak detector determining whether the amplifier is saturating based on an analysis of the set of amplified signals at the baseband frequencies subsequent to filtering by the first filter.

11. The receiver of claim 1, wherein a cut-off frequency of the first filter is substantially the same as a cut-off frequency of the second filter.

12. A receiver comprising:

an antenna configured to receive a set of signals including a first signal and a second signal having a first relative difference in amplitudes;

a low-noise amplifier (LNA) having a first input coupled to the antenna;

a down-conversion mixer having an input coupled to an output of the LNA;

a low-pass filter having an input coupled to an output of the down-conversion mixer;

a high-pass filter having an input coupled to an output of the low-pass filter and configured to reverse the filtering of the low-pass filter, such that the first signal and the second signal at the baseband frequencies have a second relative difference in amplitudes that is substantially similar to the first relative difference in amplitudes;

a peak detector having an input coupled to an output of the high-pass filter and is configured to determine whether the LNA is operating at saturation; and an automatic-gain controller having an input coupled to an output of the peak detector and an output coupled to a second input of the LNA to control a gain of the LNA.

13. The receiver of claim 12, wherein the antenna is a radio frequency antenna.

14. The receiver of claim 12, wherein the down-conversion mixer is a passive mixer or Gilbert cell mixer.

15. The receiver of claim 12, wherein the down-conversion mixer is configured to down convert the set of signals to baseband frequencies.

16. The receiver of claim 15, wherein the low-pass filter, the high-pass filter, and the peak detector are configured to operate at baseband frequencies.

17. The receiver of claim 12, wherein a cut-off frequency of the low-pass filter is substantially the same as a cut-off frequency of the high-pass filter.

18. A method of operation of a receiver circuit comprising:

receiving a set of signals including a target signal and an out-of-band signal having a first relative difference in amplitudes;

amplifying the set of signals via low-noise amplification to generate a set of amplified signals;

down-converting the set of amplified signals to baseband frequencies;

filtering from the set of amplified signals the out-of-band signal;

inverse filtering the set of amplified signals for relative increase of the out-of-band signal as compared to the target signal such that the target signal and the out-of-band signal at the baseband frequencies have a second relative difference in amplitudes that is substantially similar to the first relative difference in amplitudes;

at the baseband frequencies, detecting a peak amplitude of the out-of-band signal subsequent to inverse filtering; and controlling a gain of the low-noise amplification based on the peak amplitude of the out-of-band signal subsequent to inverse filtering.

19. The method of claim 18, further comprising baseband amplifying the set of amplified signals subsequent to the filtering step for subsequent processing.

20. The method of claim 19, wherein the subsequent processing includes analog-to-digital conversion of the set of amplified signals subsequent to baseband amplifying.

21. The method of claim 18, wherein the filtering is performed by applying a first filter having a first cut-off frequency and the inverse filtering is performed by applying a second filter having a second cut-off frequency that is substantially the same as the first cut-off frequency.

22. A method of operation of a receiver circuit comprising:

receiving a set of signals including a first signal and a second signal having a first relative difference in amplitudes;

amplifying the set of signals via low-noise amplification to generate a set of amplified signals;

down-converting the set of amplified signals to baseband frequencies;

low-pass filtering the set of amplified signals at the baseband frequencies;

inverse filtering the set of amplified signals at the baseband frequencies such that the first signal and the second signal at the baseband frequencies have a second relative difference in amplitudes that is substantially similar to the first relative difference in amplitudes;

at the baseband frequencies, detecting a peak amplitude of a largest-amplitude signal in the set of signals subsequent to inverse filtering; and controlling a gain of the low-noise amplification based on the peak amplitude of the largest-amplitude signal subsequent to inverse filtering.

23. The method of claim 22, further comprising baseband amplifying the set of amplified signals subsequent to low-pass filtering for subsequent processing.

24. The method of claim 23, wherein the subsequent processing includes analog-to-digital conversion of the set of amplified signals at the baseband frequencies.

25. The method of claim 22, wherein the low-pass filtering is performed by applying a first filter having a first cut-off frequency and the inverse filtering is performed by applying a second filter having a second cut-off frequency that is substantially the same as the first cut-off frequency.

* * * * *